United States Patent [19]

Taylor

[11] Patent Number: 4,769,619

[45] Date of Patent: Sep. 6, 1988

[54] COMPENSATED CURRENT MIRROR

[75] Inventor: Stewart S. Taylor, Beaverton, Oreg.

[73] Assignee: Tektronix, Inc., Beaverton, Oreg.

[21] Appl. No.: 898,661

[22] Filed: Aug. 21, 1986

[51] Int. Cl.[4] ............................................. H03F 3/04
[52] U.S. Cl. ................................... 330/288; 323/316
[58] Field of Search ................ 330/257, 288; 323/315, 323/316

[56] References Cited

U.S. PATENT DOCUMENTS 4,462,005 7/1984 Kusakabe et al. .................. 330/288

FOREIGN PATENT DOCUMENTS 229908 12/1984 Japan .................................... 330/288

Primary Examiner—James B. Mullins
Attorney, Agent, or Firm—William S. Lovell; Daniel J. Bedell

[57] ABSTRACT

A current mirror includes first and second transistors having interconnected bases and having emitters respectively coupled through first and second resistors to a common potential source. A collector voltage of the first transistor is fed back to the transistor bases through a feedback capacitor, and through a unity gain amplifier and series resistor, to form a feedback loop for controlling the voltage at the transistor bases. A current source connected to the collector of the first transistor causes the second transistor to produce an output collector current substantially equal in magnitude to the input current. To prevent circuit instability, the feedback capacitor and the aforementioned series resistor are sized to reduce the frequency at which the open loop gain of the feedback loop is unity so that it does not exceed the short-circuit current gain-bandwidth product of the first transistor.

8 Claims, 1 Drawing Sheet

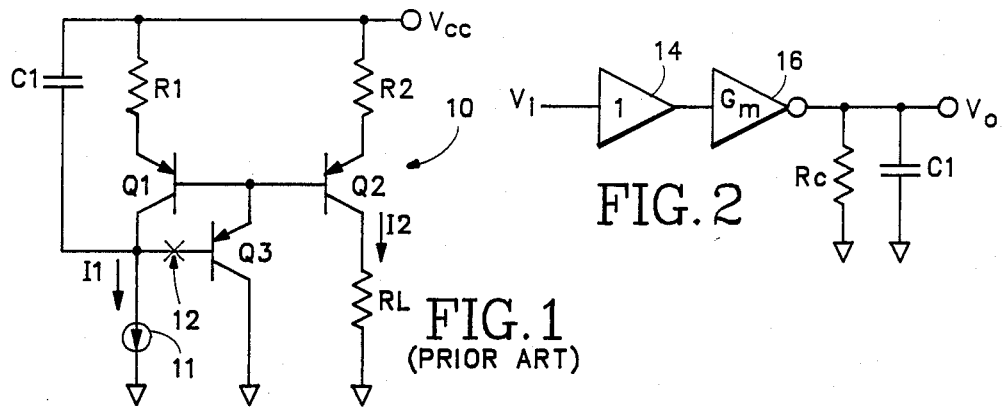
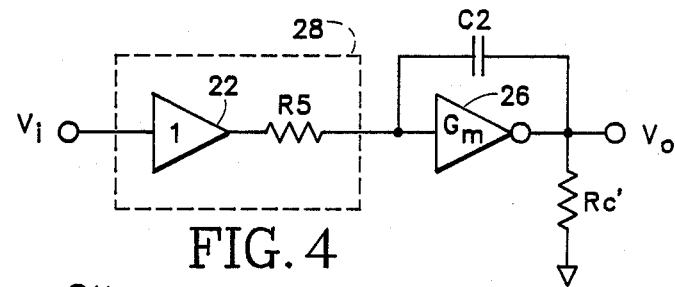
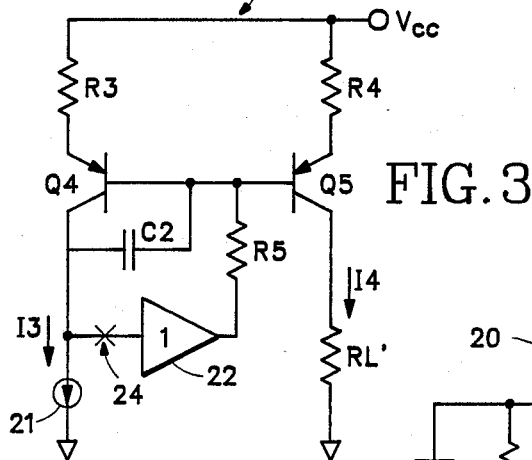
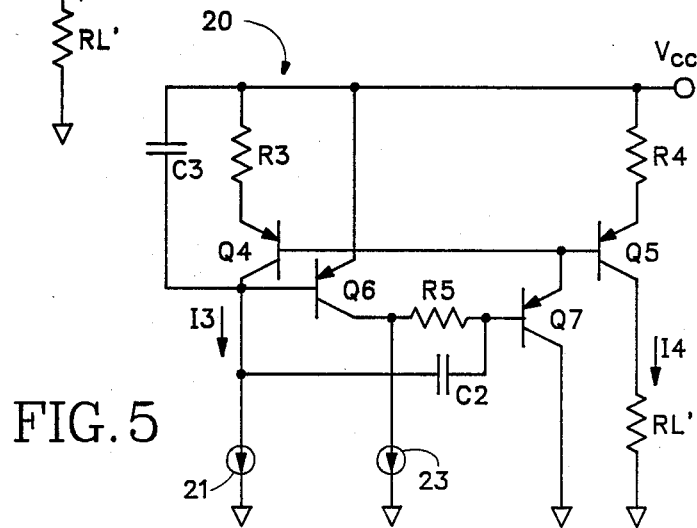
FIG. 1 (PRIOR ART)
FIG. 2
FIG. 3
FIG. 4
FIG. 5

COMPENSATED CURRENT MIRROR

BACKGROUND OF THE INVENTION

The present invention relates in general to current mirrors and in particular to a current mirror utilizing a small capacitance for stability compensation.

Current mirrors (also known as current repeaters) are widely used in integrated circuits implementing operational amplifiers, digital-to-analog converters, and the like to produce an output current which is substantially equal in magnitude to an input current. One well known current mirror employs first and second matching bipolar transistors having interconnected bases and having emitters respectively coupled through matching first and second resistors to a common potential source. A collector voltage of the first transistor is fed back to the transistor bases through a unity gain amplifier to form a feedback loop. When an input current source is connected to the collector of the first transistor, the feedback loop adjusts the base voltage so that the collector of the first transistor carries the input current. Since the bases of the first and second transistors are interconnected, and since the first and second resistors as well as the transistors are matched, the second transistor produces an output collector current substantially equal in magnitude to the input current.

To prevent circuit instability, the feedback loop is altered by connecting a compensating capacitor between the collector of the first transistor and the common potential source, the capacitor being sized to adjust the frequency, at which the absolute value of the open loop gain of the feedback loop is unity, to less than the short-circuit current gain-bandwidth product ($f_T$) of the first transistor. (The parameter $f_T$ is an inherent characteristic and is defined as the frequency at which the short-circuit common-emitter current gain of the transistor attains unity magnitude.) Unfortunately, when the short-circuit current gain-bandwidth product of the first transistor is low (as for example when it is implemented in the form of a lateral pnp transistor), the size of the compensating capacitor needed to insure circuit stability may exceed the maximum capacitance which can be realized on an integrated circuit or may require much more chip area than can be economically justified, particularly when there is no thin oxide dielectric layer on the chip for allowing higher capacitances to be realized. The requirement for a large capacitance is aggravated as the collector currents of the transistors become large, increasing the transconductance of the transistors. Therefore the compensating capacitor must be implemented in the form of a more complex and expensive discrete component connected to external terminals of the chip, consuming package pins and increasing packaging cost. What is needed is a stable, compensated current mirror which may be implemented with transistors having a low current gain-bandwidth product, without requiring a large, discrete compensating capacitance.

SUMMARY OF THE INVENTION

A current mirror includes first and second transistors having bases connected together and having emitters respectively coupled through first and second load resistors to a common potential source. A voltage on the collector of the first transistor is fed back to the transistor bases through a unity gain amplifier with a series connected output resistor to form a feedback loop for controlling the voltage at the bases of the transistors. When an input current source is connected to the collector of the first transistor, the feedback loop adjusts the base voltage of the first transistor so that its collector carries substantially all of the input current provided by the current source. Since the bases of the first and second transistors are interconnected, and since the first and second resistors and transistors are matched, the second transistor produces an output collector current substantially equal to the input current in the collector of the first transistor. According to one aspect of the invention, to reduce circuit instability, a feedback capacitor is coupled between the base and collector of the first transistor. The feedback capacitor and the series output resistor of the unity gain amplifier are sized to reduce the frequency, at which the absolute value of the open loop gain of the feedback loop is unity, to less than or equal to the short-circuit current gain-bandwidth product of the first transistor. Even when the transistors have low short-circuit current gain-bandwidth products, as in the case when the transistors are implemented as lateral pnp junction transistors or are operated at high collector current, placing the feedback capacitor between the collector and the base of the first transistor, rather than between the first transistor collector and the common potential source, and choosing an appropriate value of feedback loop resistor, reduces the size of feedback capacitor required to ensure stability. The feedback capacitor is small enough to be implemented on the same integrated circuit as the transistors, thereby eliminating the need for a discrete external capacitor component and its associated cost and complexity.

It is accordingly an object of the present invention to provide a stable current mirror which can be implemented in integrated circuit form utilizing transistors having low current gain-bandwidth products.

It is another object of the invention to provide a stabilized current mirror which can be implemented in integrated circuit form and operated at high current.

The subject matter of the present invention is particularly pointed out and distinctly claimed in the concluding portion of the specification. However, both the organization and method of operation of the invention, together with further advantages and objects thereof, will best be understood by reference to the following description taken in connection with the accompanying drawings.

DRAWINGS

FIG. 1 is a schematic diagram of a current mirror of the prior art;

FIG. 2 is a combination block and schematic diagram depicting an equivalent circuit of a feedback loop, within the current mirror of FIG. 1, in open loop form;

FIG. 3 is a schematic diagram of the current mirror according to the present invention;

FIG. 4 is a combination block and schematic diagram depicting an equivalent circuit of a feedback loop, within the current mirror of FIG. 3, in open loop form; and FIG. 5 is a more detailed schematic diagram of the current mirror of FIG. 3.

DETAILED DESCRIPTION

The present invention relates to an improvement over the current mirror circuit of the prior art and therefore it is instructive to describe the prior art current mirror first. Referring to FIG. 1 the current mirror 10 of the prior art is adapted to produce an output current I2 substantially equal in magnitude to an input current I1 from a current source 11 (which may or may not be an ideal current source). Current mirror 10 includes a pair of matching pnp transistors Q1 and Q2 having interconnected bases and having emitters coupled through similar resistors R1 and R2 to a common potential source $V_{cc}$. The collector of transistor Q1 is coupled to the base of another pnp transistor Q3 and the emitter of transistor Q3 is connected to the bases of transistors Q1 and Q2. The collector of transistor Q3 is grounded while the collector of transistor Q2 is coupled to ground through load resistor RL. When current from current source 11 is applied to the collector of transistor Q1, transistor Q3 acts as a unity gain buffering amplifier to control the base voltage on transistor Q1 such that the collector of transistor Q1 carries the input current I1. Since the bases of transistors Q1 and Q2 are tied together, since transistors Q1 and Q2 have matching characteristics, and since resistors R1 and R2 have similar resistance, transistor Q2 produces an output collector current I2 which is substantially equal in magnitude to current I1 carried by the collector of transistor Q1.

It is well known that the feedback loop created by transistor Q3 may become unstable if the frequency $f_u$, at which the absolute value of the open loop gain G of the feedback loop falls to unity, is higher than the short circuit current gain-bandwidth product $f_T$ of transistor Q1. Accordingly a compensating capacitor C1 is suitably connected between the collector of transistor Q1 and potential source $V_{cc}$, capacitor C1 being sized so as to limit $f_u$ to less than $f_T$.

FIG. 2 is a combination schematic and block diagram illustrating an equivalent circuit of the feedback loop formed by transistors Q1 and Q3 as well as resistor R1 and capacitor C1 when the loop is opened at a point 12 between the base of transistor Q3 and the collector of transistor Q1. Transistor Q3 of FIG. 1 is represented by a unity gain amplifier 14, an approximation of the small signal behavior of Q3. Transistor Q1 of FIG. 1 acts as a common-emitter amplifier with emitter degeneration provided by resistor R1 and is represented in FIG. 2 by an inverting transconductance amplifier 16 producing an output current (at the collector current of Q1) which is proportional to an input voltage (the base voltage of Q1), the ratio of proportionality being the transconductance $G_m$ of the amplifier. For a common-emitter amplifier with emitter degeneration, amplifier transconductance $G_m$ is approximately $g_m/(1+g_m R1)$ where $g_m$ is the transconductance of transistor Q1, the ratio of collector current to the thermal voltage $V_T$ of the base-emitter junction, and R1 is the emitter degeneration resistance. (The thermal voltage $V_T$ is equal to Boltzman's constant K times the absolute temperature of the junction divided by the charge on an electron.)

The output of amplifier 16 is coupled to ground through the parallel combination of capacitor C1 and a resistance Rc representing the total resistance to ground from the collector of transistor Q1 of FIG. 1, including the high internal resistance of current source 11, and the high resistances to ground through transistor Q3 and through resistor R1 via transistor Q1. A small signal input voltage $v_i$ applied to the input of amplifier 14 results in a proportional small signal current output in amplifier 16 applied to the parallel combination of Rc and C1. The absolute value of the small signal open loop gain G for the feedback loop associated with transistor Q1 of FIG. 1 is determined by the expression:

$$|G| = |v_o/v_i|$$
$$= |G_m[(Rc/j\omega C1)/(Rc + (1/j\omega C1))]|$$
$$= |G_m Rc/(1 + j\omega C1 Rc)|$$

where $\omega$ is the operating frequency in radians per second. Since $\omega C1 Rc$ is much larger than 1 for higher frequencies of interest, $$|G| \simeq |G_m Rc/(j\omega C1 Rc)|$$
$$\simeq G_m/\omega C1.$$

Since $G_m \simeq g_m/(1+g_m R1)$, $$|G| \simeq g_m/(1+g_m R1)\omega C1.$$

When $g_m R1$ is much larger than 1, $$|G| \simeq 1/\omega R1 C1.$$

Thus the frequency $\omega_u(=2\pi f_u)$ at which the magnitude of the open loop gain $|G|$ is equal to 1 is approximately equal to $1/R1C1$. As previously mentioned, it is desirable that $f_u$ not exceed $f_T$ in order to insure that the feedback loop formed by transistors Q1 and Q3 remain stable. When transistors Q1 and Q3 are implemented in an integrated circuit as lateral pnp transistors, the $f_T$ of the transistors is relatively low, approximately 5-40 MHz. Assuming for example, that $f_T$ is 10 MHz and R1 is 500 Ohms, a compensating capacitor C1 having a value of at least 31.8 pF would be required. This is a relatively large capacitance which may not be practical to implement in integrated circuit form or which may consume an unacceptably large amount of chip area, particularly when there is no thin oxide dielectric layer in the chip allowing implementation of larger capacitances. Thus when the prior art current mirror circuit of FIG. 1 was implemented utilizing transistors having a low $f_T$, the compensating capacitor C1 had to be provided in discrete form external to the chip. This is complicated and expensive and requires at least one additional pin on the chip package. It is noted the minimum size required for capacitor C1 could be reduced by increasing the size of R1. However, doing so might require a larger voltage $V_{cc}$ and/or reduce the voltage compliance (swing) at the collectors of Q1 and Q2. A larger voltage supply $V_{cc}$ would increase the power dissipation of the circuit. It should also be noted that if, for example, R1 is small, $G_m$ is approximately equal to $g_m$, and as I1 increases $G_m$ increases, thereby requiring a larger capacitance C1.

Referring to FIG. 3, there is depicted in combination block and circuit diagram form a current mirror 20 according to the present invention adapted to produce an output current I4 through a load resistor RL', wherein the magnitude of I4 is equal to the magnitude of an input current I3 from a current source 21. Current mirror 20 includes a matching pair of pnp transistors Q4 and Q5 having interconnected bases and having their emitters coupled through matching first and second load resistors R3 and R4 to a common potential source $V_{cc}$. The collector of transistor Q4 is connected to the input of a unity gain amplifier 22, while the output of amplifier 22 is coupled to the bases of transistors Q4 and Q5 through a series resistor R5. The collector of transistor Q5 is coupled to ground through the load resistor RL'. The collector of transistor Q4 is coupled to its base through a capacitor C2. Amplifier 22 provides feedback to the base of transistor Q4 through R5, which feedback allows Q4 to carry current I3 when current source 21 is connected to the collector of Q4. Capacitor C2 is provided to stabilize the feedback loop in the circuit according to the present invention.

FIG. 4 is a combination schematic and block diagram representation of an equivalent circuit of the feedback loop when the loop is opened at point 24 between the input of unity gain amplifier 22 and the collector of transistor Q4. Transistor Q4 of FIG. 3 (like transistor Q1 of FIG. 1) acts as a common-emitter amplifier with emitter degeneration provided by resistor R3 and is represented in FIG. 4 by an inverting transconductance amplifier 26 having a transconductance $G_m$ of approximately $g_m/(1+g_m R3)$ where $g_m$ is the transconductance of transistor Q4. The output of amplifier 26 is coupled to ground through a resistance Rc' representing the relatively high resistance between the collector of transistor Q4 of FIG. 1 and ground. The output $v_o$ of amplifier 26 (corresponding to the collector voltage of transistor Q4 of FIG. 3) is fed back to its input (i.e. to the base of transistor Q4) through capacitor C2. Due to feedback from capacitor C2 and the voltage gain provided by amplifier 26 acting through the high impedance Rc', the input of amplifier 26 is at virtual ground.

A small signal input voltage $v_i$ is applied to the input of amplifier 22 and the output of amplifier 22 is coupled through resistor R5 to the input of amplifier 26. Amplifier 22 and resistor R5 form another transconductance amplifier 28 having a transconductance $G_{m1}$ of $1/R5$ which produces an output current of magnitude $v_i/R5$. Since the input impedance of amplifier 26 is relatively high, substantially all of the output current of transconductance amplifier 28 passes through capacitor C2 and the potential developed across C2 is approximately equal to $v_i/j\omega R5 C2$. Since the input of amplifier 26 is at virtual ground, the output voltage $v_o$ is also approximately equal to $v_i/j\omega R5 C2$. Therefore the absolute value of the open loop gain $|G|$ at intermediate and high frequencies is given by:

$$|G| \simeq |v_o|v_i| \simeq 1/\omega R5 C2.$$

Thus the frequency $\omega_u (= 2\pi f_u)$ at which $|G|$ is equal to 1 is approximately equal to $1/R5C2$. Note that the value of the transfer function is independent of the transconductance $G_m$ of amplifier 26 and therefore is independent of the value of R3. As with the previously discussed feedback loop of the prior art circuit, it is required that $f_u$ be no greater than $f_T$ in order to insure that the feedback loop of the circuit remains stable. Resistor R5 may be relatively large (for example, 10K Ohms) without disrupting circuit operation by dropping an excessively large voltage. Assuming, as in the previous example for the prior art circuit, that $f_T$ is 10 MHz, and further assuming that R5 is 10K Ohms, C2 need only be 1.6 pF. This capacitor is suitably small so that it may be implemented in integrated circuit form. Thus the current mirror circuit 20 of FIG. 3 according to the present invention does not require the use of an off-chip capacitor or integrated capacitor requiring a large chip area, for feedback loop stabilization when the transistors Q4 and Q5 have low $f_T$ and/or when the transconductance of Q4 is very large.

It should be noted that the existence of capacitor C2 in the circuit of FIG. 3 introduces a right half plane zero at a frequency fz of approximately $\frac{1}{2}\pi R3 C2$ which can cause ringing if $f_z$ occurs too close to $f_u$. Since $f_z/f_u$ is approximately equal to R5/R3, R5 is selected to be at least several times larger than R3.

Referring to FIG. 5, the current mirror 20 of FIG. 3 is depicted in schematic diagram form including a more detailed embodiment of amplifier 22 of FIG. 3. As in FIG. 3, the current mirror 20 of FIG. 5 includes pnp transistors Q4 and Q5 having interconnected bases and having emitters respectively coupled through matching first and second load resistors R3 and R4 to the common potential source $V_{cc}$. The collector of transistor Q5 is coupled to ground through resistor RL' and the collector of transistor Q4 is applied to the base of an npn transistor Q6. The potential source $V_{cc}$ is supplied to the collector of transistor Q6 while a current source 23 is connected to the emitter of transistor Q6. The emitter of transistor Q6 is further coupled to the base of pnp transistor Q7 through resistor R5 and the collector of transistor Q4 is coupled to the base of transistor Q7 through capacitor C2. The emitter of transistor Q7 is attached to the bases of transistors Q4 and Q5 with the collector of transistor Q7 being grounded.

Transistor Q6 acts as an emitter follower to fulfill the function of unity gain amplifier 22 of FIG. 3 by producing an output signal at its emitter which varies with the input signal at its base. Since the emitter voltage of Q6 is one pn junction drop below the collector voltage on transistor Q4, transistor Q7 is employed to level shift upward, by one pn junction drop, the feedback voltage produced by transistor Q6 and resistor R5 before the feedback voltage is applied to the bases of transistors Q4 and Q5. The current gain of Q7 also keeps the DC current through R5 small, enabling R5 to be relatively large in magnitude if required. Capacitor C2 may be connected to the base of transistor Q7 as shown in FIG. 5 or, in an alternative embodiment, may be connected directly to the bases of transistors Q4 and Q5.

It has been found experimentally that a capacitor C3 connected between $V_{cc}$ and the collector of transistor Q4 of FIG. 5 may be additionally useful to reduce ringing. However in the present circuit the magnitude of such additional capacitor C3 can be quite small, on the order of a few pF, so it may also be implemented in integrated circuit form.

The current mirror 20 of the present invention is adapted to produce an output current substantially equal in magnitude to an input current, utilizing transistors having a low short-circuit current gain-bandwidth product and/or large transconductances, without requiring a large compensating capacitor to ensure stability. While the preferred embodiment of the present invention employs bipolar pnp junction transistors, the present invention may be implemented utilizing various types of transistors including npn junction transistors, MOSFETS, MESFETS or the like wherein a voltage applied to a control terminal (such as a transistor base or gate) can control a current through two load terminals (such as an emitter and a collector, or a drain and a source). The present invention may also be used in current mirrors in which the output current is scaled to, rather than equal to, the input current by scaling the emitter areas of Q4 and Q5 and the ratio of R3 and R4. Furthermore, the invention is suitable for compensating current mirrors (sources or sinks) providing a multiplicity of output currents proportional to the input current through a multiplicity of transistors Q5 having bases connected to the base of transistor Q4 and having emitters coupled to $V_{cc}$ through separate emitter resistors. Thus, while a preferred embodiment of the invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A current mirror comprising:
    a potential source;
    first and second transistors each having a base, a collector and an emitter, the emitters of said first and second transistors each being resistively coupled to said potential source;
    a resistor;
    an amplifier having an input terminal and an output terminal, the collector of said first transistor being connected to the input terminal of said amplifier, the output terminal of said amplifier being coupled through said resistor to the bases of said first and second transistors; and
    a capacitor for capacitively coupling the collector of said first transistor to its base, said first transistor, said resistor, said amplifier and said capacitor forming a feedback loop for controlling a voltage at the bases of said first and second transistors.

2. The current mirror according to claim 1 wherein said resistor and capacitor are sized such that the frequency of operation at which an open loop gain of said feedback loop is unity does not exceed a predetermined frequency.

3. The current mirror according to claim 1 wherein said predetermined frequency is equal to a short-circuit current gain-bandwidth product characteristic of the first transistor.

4. The current mirror according to claim 1 wherein said first and second transistors and said capacitor are implemented in a common integrated circuit.

5. The current mirror according to claim 1 wherein said first and second transistors are pnp junction transistors.

6. The current mirror according to claim 1 wherein said first and second transistors are lateral pnp transistors implemented in a common integrated circuit.

7. A current mirror comprising:
    a potential source;
    first and second transistors each having a base, a collector and an emitter, the emitters of said first and second transistors each being resistively coupled to said potential source;
    a resistor;
    a current source;
    a third transistor having a base coupled to the collector of said first transistor, a collector coupled to said potential source, and an emitter coupled to said current source;
    a fourth transistor having a base coupled to the emitter of said third transistor through said resistor and having an emitter coupled to the bases of said first and second transistors; and
    a capacitor for capacitively coupling the collector of said first transistor to the base of said fourth transistor, said resistor, said first, third and fourth transistors, and said capacitor forming a feedback loop for controlling a voltage at the bases of said first and second transistors.

8. The current mirror according to claim 7 wherein said first, second and fourth transistors are lateral pnp transistors and said third transistor is an npn transistor, said first, second, third and fourth transistors and said capacitor being implemented on a common integrated circuit.

* * * * *

UNITED STATES PATENT AND TRADEMARK OFFICE
CERTIFICATE OF CORRECTION

PATENT NO. : 4,769,619

DATED : September 6, 1988

INVENTOR(S) : Stewart S. Taylor

It is certified that error appears in the above-identified patent and that said Letters Patent is hereby corrected as shown below:

Figure 5 should appear as shown on the attached sheet.

Signed and Sealed this

Fourteenth Day of February, 1989

Attest:

DONALD J. QUIGG

*Attesting Officer*  *Commissioner of Patents and Trademarks*

UNITED STATES PATENT AND TRADEMARK OFFICE
CERTIFICATE OF CORRECTION

PATENT NO. : 4,769,619

DATED : September 6, 1988

INVENTOR(S) : Stewart S. Taylor

It is certified that error appears in the above—identified patent and that said Letters Patent is hereby corrected as shown below:

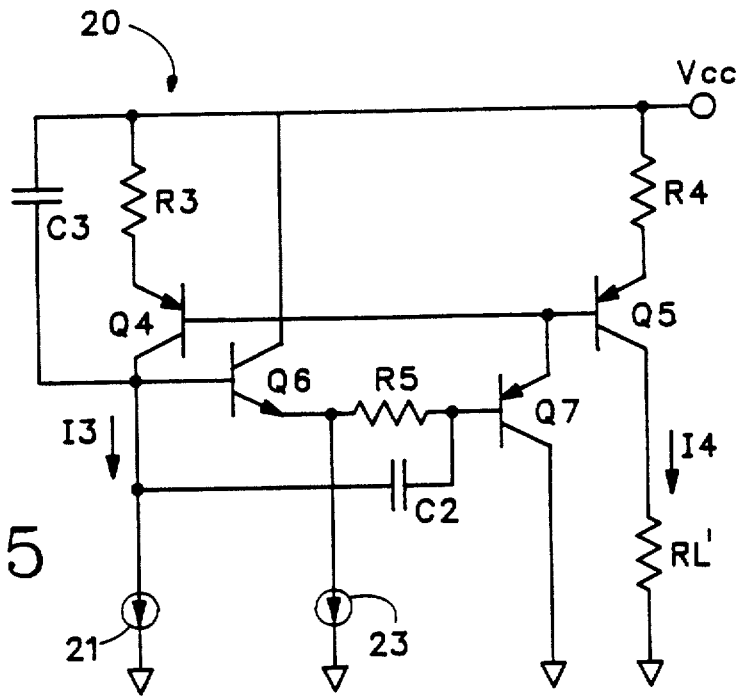

FIG. 5